United States Patent
Sawano et al.

(10) Patent No.: US 10,581,424 B2
(45) Date of Patent: Mar. 3, 2020

(54) POWER SUPPLY CONTROL DEVICE AND POWER SUPPLY CONTROL METHOD

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Shunichi Sawano, Mie (JP); Yuuki Sugisawa, Mie (JP)

(73) Assignees: AutoNetworks Technologies, Ltd., Yokkaichi, Mie (JP); Sumitomo Wiring Systems, Ltd., Yokkaichi-Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/217,691

(22) Filed: Dec. 12, 2018

(65) Prior Publication Data

US 2019/0181850 A1 Jun. 13, 2019

(30) Foreign Application Priority Data

Dec. 12, 2017 (JP) ................................ 2017-237974

(51) Int. Cl.
*H03K 17/0812* (2006.01)
*H03K 5/156* (2006.01)

(52) U.S. Cl.
CPC ..... *H03K 17/08122* (2013.01); *H03K 5/1565* (2013.01)

(58) Field of Classification Search
CPC .... H03K 17/063; H03K 17/12; H03K 17/145; H03K 17/16; H03K 17/18; H03K 17/22
USPC .......................... 327/108, 109, 110, 111, 112
See application file for complete search history.

(56) References Cited

U.S. PATENT DOCUMENTS

2014/0078629 A1\* 3/2014 Cortigiani .......... H03K 17/0822
361/79

FOREIGN PATENT DOCUMENTS

JP 2017-103683 A 6/2017

\* cited by examiner

*Primary Examiner* — John W Poos
(74) *Attorney, Agent, or Firm* — Honigman LLP

(57) ABSTRACT

A power supply control device and a power supply control method capable of detecting a switch-related failure properly are provided. A power supply control device controls power supply via a switch. An output unit of a microcomputer produces a switching signal that instructs the switch to turn alternately on and off. A detection circuit reports a failure related to the switch if an accumulated period has reached or exceeded a threshold period. The accumulated period is accumulation of one or more periods when the switching signal instructs the switch to turn on but a comparator does not detect an on-state of the switch.

16 Claims, 9 Drawing Sheets

POWER SUPPLY CONTROL DEVICE AND POWER SUPPLY CONTROL METHOD

CROSS-REFERENCE TO RELATED APPLICATIONS

This application claims priority of Japanese Patent Application No. JP 2017-237974 filed Dec. 12, 2017.

TECHNICAL FIELD

The present disclosure relates to a power supply control device and a power supply control method.

BACKGROUND

A vehicle is equipped with a power supply control device for controlling power supply from a battery to a load (e.g., JP 2017-103683A). The power supply control device disclosed in JP 2017-103683A turns on or off a switch that is provided in a current path from a battery to a load, according to a switching signal that instructs the switch to turn on or off. Power supply to the load is controlled by this switching operation.

When the switch is on, the voltage across the switch is approximately 0 V. When the switch is off, the voltage across the switch is high. If a period when the switching signal instructs the switch to turn on but the voltage across the switch is not less than a prescribed voltage reaches or exceeds a predetermined period, the power supply control device disclosed in JP 2017-103683A decides that the switch is not turned on properly and detects a switch-related failure. If the switching signal instructs the switch to turn off, the period when the voltage across the switch is not less than the prescribed voltage is initialized to zero.

As a known configuration for supplying electric power to a load, a switch may be turned alternately on and off, that is, turned on and off under PWM (pulse width modulation) control. When electric power is supplied to the load in this configuration, the switching signal instructs the switch to turn alternately on and off. For example, this configuration controls the duty ratio of the switching signal, based on the output voltage of the battery, and can thereby apply the voltage to the load at a prescribed average voltage, irrespective of the varying output voltage of the battery.

Suppose that the power supply control device disclosed in JP 2017-103683A is modified to supply electric power to the load by turning on and off the switch alternately and repeatedly. In this modified configuration, as far as the period when the switching signal continuously instructs the switch to turn on is less than the above-mentioned predetermined period, the period when the voltage across the switch is not less than the prescribed voltage will not reach or exceed the predetermined period. Eventually, even when the switch is not turned on properly in response to the switching signal, this power supply control device does not detect a switch-related failure.

An object of the present disclosure, which is made in consideration of such circumstances, is to provide a power supply control device and a power supply control method which can properly detect a switch-related failure.

SUMMARY

A power supply control device according to an aspect of the present disclosure is a device for controlling power supply via a switch. This power supply control device includes an output unit configured to produce a switching signal that instructs the switch to turn alternately on and off, an on-detection unit configured to detect an on-state of the switch, and a reporting unit configured to report a failure related to the switch if an accumulated period has reached or exceeded a threshold period, the accumulated period being an accumulation of periods for which the switching signal produced by the output unit instructs the switch to turn on but the on-detection unit does not detect the on-state of the switch.

A power supply control method according to an aspect of the present disclosure is a method for controlling power supply via a switch. This power supply control method includes the steps of producing a switching signal that instructs the switch to turn alternately on and off, detecting an on-state of the switch, and reporting a failure related to the switch if an accumulated period has reached or exceeded a threshold period, the accumulated period being an accumulation of periods for which the produced switching signal instructs the switch to turn on but the on-state of the switch is not detected.

Effects of the Disclosure

The above-mentioned aspects enable proper detection of a switch failure.

DETAILED DESCRIPTION OF PREFERRED EMBODIMENTS

Figure 1:
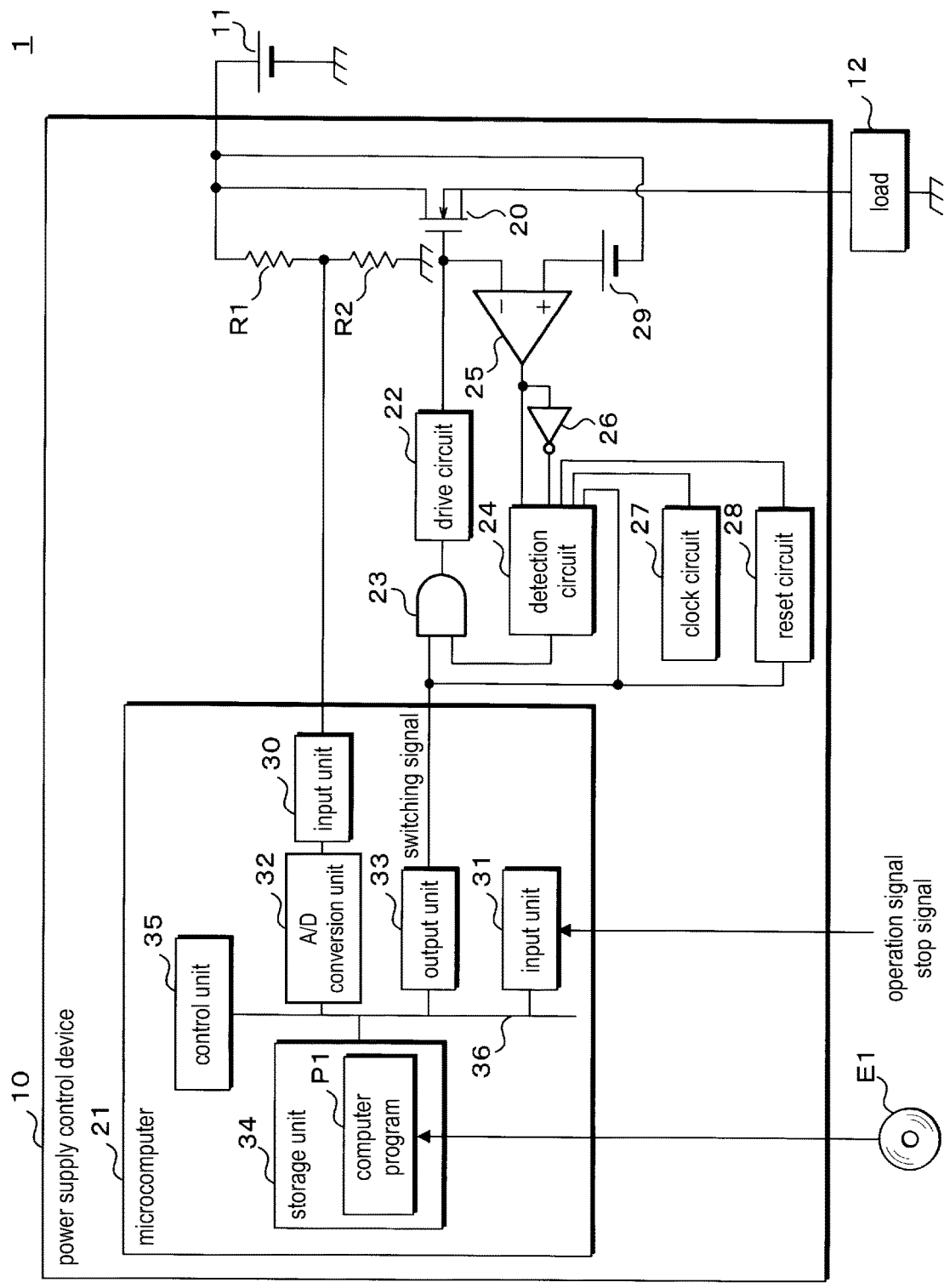
FIG. 1 is a block diagram showing a main configuration of a power system in Embodiment 1.

To start with, aspects of the present disclosure are mentioned one by one. Embodiments to be described later may be, at least partially, combined freely.

A power supply control device according to one aspect of the present disclosure is a device for controlling power supply via a switch. This power supply control device includes an output unit configured to produce a switching signal that instructs the switch to turn alternately on and off, an on-detection unit configured to detect an on-state of the switch, and a reporting unit configured to report a failure related to the switch if an accumulated period has reached or exceeded a threshold period, the accumulated period being an accumulation of periods for which the switching signal produced by the output unit instructs the switch to turn on but the on-detection unit does not detect the on-state of the switch.

A power supply control device according to another aspect of the present disclosure further includes an initialization unit configured to initialize the accumulated period when the on-detection unit detects the on-state of the switch.

In a power supply control device according to yet another aspect of the present disclosure, the switch is a semiconductor switch. The switch is on when a voltage at a control terminal of the switch is greater than a threshold voltage. The on-detection unit detects the on-state if the voltage at the control terminal is greater than the threshold voltage.

In a power supply control device according to still another aspect of the present disclosure, the on-detection unit detects the on-state if a voltage at an output terminal of the switch where the current comes out is greater than a second threshold voltage.

A power supply control device according to a different aspect of the present disclosure further includes a changeover unit configured to turn off the switch if the reporting unit reports the failure, irrespective of the switching signal produced by the output unit.

A power supply control device according to another different aspect of the present disclosure further includes an adjustment unit configured to adjust a duty ratio of the switching signal produced by the output unit, depending on a voltage at an input terminal of the switch where the current enters.

A power supply control method according to one aspect of the present disclosure is a method for controlling power supply via a switch. This power supply control method includes the steps of producing a switching signal that instructs the switch to turn alternately on and off, detecting an on-state of the switch, and reporting a failure related to the switch if an accumulated period has reached or exceeded a threshold period, the accumulated period being an accumulation of periods for which the produced switching signal instructs the switch to turn on but the on-state of the switch is not detected.

The power supply control device and the power supply control method according to the above-mentioned aspects detect a switch-related failure, based on the accumulated period which is accumulation of one or more periods when the switching signal instructs the switch to turn on but the on-state of the switch is not detected. Consequently, a switch-related failure is properly detected and reported as long as the switch does not turn on, even if the period when the switching signal continuously instructs the switch to turn on is less than the threshold period. A failure related to the switch may be, for example, a failure of the switch itself or a failure of the changeover unit.

The power supply control device according to the above-mentioned aspect usually requires a period after the switching signal instructs the switch to turn on and before the switch actually turns on. According to another aspect as above, the power supply control device initializes the accumulated period, on detection of the on-state of the switch. Such initialization avoids erroneous reporting of a switch-related failure due to accumulation of the period after the switching signal instructs the switch to turn on and before the switch actually turns on.

The power supply control device according to yet another aspect as above reports a switch-related failure if an accumulated period has reached or exceeded the threshold period, the accumulated period being an accumulation of periods for which the switching signal instructs the switch to turn on but the voltage at the control terminal of the switch is less than the threshold voltage.

The power supply control device according to still another aspect as above reports a switch-related failure if an accumulated period has reached or exceeded the threshold period, the accumulated period being an accumulation of periods for which the switching signal instructs the switch to turn on but the voltage at the output terminal of the switch is less than the second threshold voltage.

The power supply control device according to the different aspect as above turns off the switch if a switch-related failure is reported, irrespective of the switching signal.

The power supply control device according to another different aspect as above adjusts the duty ratio, depending on the voltage at the input terminal of the switch. Such a device can adjust, for example, the average output voltage through the switch to a prescribed value, irrespective of the voltage at the input terminal of the switch.

Specific examples of a power system concerning the embodiments of the present disclosure are hereinafter described with reference to the drawings. It should be understood that the present disclosure is not limited to the following examples, but is intended to encompass all variations and modifications indicated by, equivalent to, and falling within the appended claims.

Embodiment 1

FIG. 1 is a block diagram showing a main configuration of a power system 1 in Embodiment 1. The power system 1, suitably installed in a vehicle, includes a power supply control device 10, a battery 11, and a load 12. The power supply control device 10 is separately connected with the positive electrode of the battery 11 and an end of the load 12. The negative electrode of the battery 11 and the other end of the load 12 are grounded.

The battery 11 supplies electric power to the load 12 through the power supply control device 10. The load 12 is an electric device installed in a vehicle. The load 12 operates while the battery 11 supplies electric power to the load 12. The load 12 stops when the power supply from the battery 11 to the load 12 has ceased.

The power supply control device 10 receives an operation signal for operating the load 12 and a stop signal for stopping the load 12. On receiving the operation signal, the power supply control device 10 establishes an electrical connection between the battery 11 and the load 12, thereby allowing the battery 11 to supply power to the load 12 and causing the load 12 to operate. On receiving the stop signal, the power supply control device 10 shuts off the electrical connection between the battery 11 and the load 12, thereby discontinuing the power supply from the battery 11 to the load 12 and stopping the load 12. The power supply control device 10 thus controls the power supply from the battery 11 to the load 12.

The power supply control device 10 includes a switch 20, a microcomputer 21, a drive circuit 22, a first AND circuit 23, a detection circuit 24, a comparator 25, an inverter 26, a clock circuit 27, a reset circuit 28, and a DC power 29. The switch 20 is a semiconductor switch, specifically an N-channel FET (Field Effect Transistor). The first AND circuit 23 has two input ends and one output end. The comparator 25 has a positive terminal, a negative terminal, and an output terminal. The microcomputer 21 has input units 30, 31, an A/D (Analog/Digital) conversion unit 32, an output unit 33, a storage unit 34, and a control unit 35.

The drain of the switch 20 is connected with the positive electrode of the battery 11. The source of the switch 20 is connected with an end of the load 12. The drain of the switch 20 is also connected with an end of a resistor R1. The other end of the resistor R1 is connected with an end of a resistor R2. The other end of the resistor R2 is grounded. The connecting node between the resistors R1, R2 is connected with the input end of the input unit 30 of the microcomputer 21.

The gate of the switch 20 is connected with the output end of the drive circuit 22. The input end of the drive circuit 22 is connected with the output end of the first AND circuit 23. The first input end of the first AND circuit 23 is connected with the output end of the output unit 33 of the microcomputer 21. The second input end of the first AND circuit 23 is connected with the detection circuit 24.

The detection circuit 24 is also separately connected with the output end of the output unit 33 of the microcomputer 21, the output terminal of the comparator 25, the output end of the inverter 26, the output end of the clock circuit 27, and the output end of the reset circuit 28. The input end of the inverter 26 is connected with the output terminal of the comparator 25. The input end of the reset circuit 28 is connected with the output end of the output unit 33 of the microcomputer 21. The negative terminal of the comparator 25 is connected with the gate of the switch 20. The positive terminal of the comparator 25 is connected with the positive electrode of the DC power 29. The negative electrode of the DC power 29 is connected with the drain of the switch 20.

In the microcomputer 21, the input unit 30 is connected with the A/D conversion unit 32. The input unit 31, the A/D conversion unit 32, the output unit 33, the storage unit 34, and the control unit 35 are separately connected with an internal bus 36.

In the switch 20, the greater the gate voltage with respect to the source potential is, the smaller is the resistance between the drain and the source. If the gate voltage of the switch 20 with respect to the source potential is equal to or greater than a particular on-threshold value, the resistance between the drain and the source is small enough to conduct the current through the drain and the source. The switch 20 is on in this situation. When the switch 20 is on, the battery 11 is electrically connected with the load 12 and supplies electric power to the load 12 through the switch 20. In the switch 20, the current flows from the drain to the source. Thus, the drain of the switch 20 is the input terminal where the current enters, and the source of the switch 20 is the output terminal where the current comes out.

When the switch 20 is on, the source voltage with respect to the grounding potential substantially matches the output voltage of the battery 11. Hence, when the switch 20 is on, the gate voltage with respect to the grounding potential is adjusted to a voltage greater than the output voltage of the battery 11. The output voltage of the battery 11 is the voltage with respect to the grounding potential.

If the gate voltage of the switch 20 with respect to the source potential is less than a particular off-threshold value that is lower than the on-threshold value, the resistance between the drain and the source is high enough to prevent the current from flowing through the drain and the source. The switch 20 is off in this situation. When the switch 20 is off, the battery 11 is electrically disconnected from the load 12 and stops the power supply to the load 12.

When the switch 20 is off, the gate voltage with respect to the grounding potential is approximately 0 V and less than the output voltage of the battery 11.

The output unit 33 of the microcomputer 21 supplies, as instructed by the control unit 35, a switching signal that is at a high-level voltage and a low-level voltage to the first AND circuit 23. A switching signal that is at the high-level voltage instructs the switch 20 to turn on, and a switching signal that is at the low-level voltage instructs the switch 20 to turn off.

The detection circuit 24 detects a failure related to the switch 20 if the switch 20 does not turn on properly. When the detection circuit 24 does not detect a failure related to the switch 20, a high-level voltage is supplied from the detection circuit 24 to the first AND circuit 23. When the detection circuit 24 detects a failure related to the switch 20, a low-level voltage is supplied from the detection circuit 24 to the first AND circuit 23.

When the first AND circuit 23 receives the high-level voltage from the detection circuit 24, the switching signal fed from the output unit 33 is supplied from the first AND circuit 23 to the input end of the drive circuit 22. When the first AND circuit 23 receives the low-level voltage from the detection circuit 24, a low-level voltage is supplied from the first AND circuit 23 to the drive circuit 22, irrespective of the switching signal fed from the output unit 33.

If the switching signal supplied from the first AND circuit 23 to the drive circuit 22 changes from the low-level voltage to the high-level voltage, the drive circuit 22 raises the gate voltage of the switch 20 with respect to the grounding potential, to a voltage greater than the output voltage of the battery 11. As a result, the gate voltage of the switch 20 with respect to the source potential reaches or exceeds the on-threshold value, and the switch 20 turns on.

For example, the drive circuit 22 boosts the output voltage of the battery 11 and applies this boosted voltage to the gate of the switch 20. The drive circuit 22 thereby raises the gate voltage of the switch 20 with respect to the ground potential, to a voltage greater than the output voltage of the battery 11. The drive circuit 22 keeps the gate voltage above the output voltage of the battery 11 and thereby keeps the switch 20 on.

Similarly, if the switching signal supplied from the first AND circuit 23 to the drive circuit 22 changes from the high-level voltage to the low-level voltage, the drive circuit 22 reduces the gate voltage with respect to the ground potential. As a result, the gate voltage of the switch 20 with respect to the source potential decreases below the off-threshold value, and the switch 20 turns off.

Also if the first AND circuit 23 receives a low-level voltage from the detection circuit 24 and thereby feeds the low-level voltage to the drive circuit 22, the drive circuit 22 turns off the switch 20 in the same manner.

As described above, if the detection circuit 24 supplies a high-level voltage to the first AND circuit 23, that is, if the detection circuit 24 does not detect a failure related to the switch 20, the drive circuit 22 turns the switch 20 on or off, according to the voltage of the switching signal produced by the output unit 33 of the microcomputer 21. The power supply from the battery 11 to the load 12 through the switch 20 is thus controllable. A failure related to the switch 20 may be, for example, a failure of the switch 20 itself or a failure of the drive circuit 22.

Resistors R1, R2 divide the output voltage of the battery 11. The resistors R1, R2 supply the divided voltage, as analog voltage information indicating the output voltage of the battery 11, to the input unit 30 of the microcomputer 21. In this description, K denotes a positive real number less than 1. The voltage divided by the resistors R1, R2, i.e., the voltage information, is expressed by K. (the output voltage of the battery 11). The real number K is a fixed value determined by the resistances of the resistors R1, R2, and is, for example, 0.1.

On receiving the analog voltage information, the input unit 30 supplies the received analog voltage information to the A/D conversion unit 32. The A/D conversion unit 32 converts the analog voltage information supplied from the input unit 30 to digital voltage information. The digital voltage information converted by the A/D conversion unit 32 is sent from the A/D conversion unit 32 to the control unit 35. The output voltage of the battery 11 indicated by the voltage information acquired by the control unit 35 is substantially equal to the output voltage of the battery 11 at the time of acquisition.

The input unit 31 receives the operation signal and the stop signal. On receiving the operation signal or the stop signal, the input unit 31 reports the received signal to the control unit 35.

The storage unit 34 is a non-volatile memory. The storage unit 34 stores a computer program P1. The control unit 35 has one or more CPUs (Central Processing Units). By executing the computer program P1, the one or more CPUs in the control unit 35 perform a power supply control process for controlling the power supply from the battery 11 to the load 12.

The control unit 35 performs the power supply control process periodically. In the power supply control process, the control unit 35 determines whether the input unit 31 has received an operation signal. If the control unit 35 confirms the input of an operation signal, the control unit 35 instructs the output unit 33 to supply a switching signal that alternates between the high-level voltage and the low-level voltage, that is, the switching signal that instructs the switch 20 to turn alternately on and off, to the first AND circuit 23. Then, the control unit 35 ends the power supply control process.

Suppose that the detection circuit 24 supplies a high-level voltage, that is, that the detection circuit 24 does not detect a failure related to the switch 20. In this situation, if the output unit 33 produces a switching signal that alternates between the high-level voltage and the low-level voltage, the drive circuit 22 turns the switch 20 alternately on and off and repeatedly according to the switching signal produced by the output unit 33, that is, it turns the switch 20 on and off under PWM control. Such switching initiates the power supply from the battery 11 to the load 12 and causes the load 12 to operate.

If the control unit 35 confirms the absence of an operation signal, the control unit 35 then determines whether the input unit 31 has received a stop signal. If the control unit 35 confirms the input of a stop signal, the control unit 35 instructs the output unit 33 to supply a switching signal with a low-level voltage to the first AND circuit 23. Then, the control unit 35 ends the power supply control process.

Suppose that the detection circuit 24 supplies a high-level voltage. In this situation, if the output unit 33 produces a switching signal with a low-level voltage, the drive circuit 22 turns the switch 20 off, according to the switching signal produced by the output unit 33. Such switching stops the power supply from the battery 11 to the load 12 and causes the load 12 to stop.

If the control unit 35 confirms the absence of a stop signal, the control unit 35 ends the power supply control process.

When the switching signal supplied from the output unit 33 to the first AND circuit 23 alternate between the high-level voltage and the low-level voltage, this switching signal periodically changes from the low-level voltage to the high-level voltage or from the high-level voltage to the low-level voltage. By executing the computer program P1, the one or more CPUs in the control unit 35 further perform a duty ratio adjustment process for adjusting the duty ratio of the switching signal.

The duty ratio of the switching signal is the ratio of the high-level voltage period in one cycle of the switching signal. The duty ratio is greater than 0 and less than 1.

The computer program P1 causes the one or more CPUs in the control unit 35 to execute the power supply control process and the duty ratio adjustment process.

When the switching signal supplied from the output unit 33 to the first AND circuit 23 alternates between the high-level voltage and the low-level voltage, the control unit 35 periodically performs the duty ratio adjustment process. In the duty ratio adjustment process, the control unit 35 acquires the voltage information from the A/D conversion unit 32. Next, the control unit 35 determines the duty ratio, based on the output voltage of the battery 11 indicated by the acquired voltage information, that is, based on the drain voltage of the switch 20. Finally, the control unit 35 instructs the output unit 33 to change the duty ratio of the switching signal to the determined duty ratio, and ends the duty ratio adjustment process.

The control unit 35 adjusts the duty ratio of the switching signal produced by the output unit 33 in the above-mentioned manner, depending on the drain voltage of the switch 20. The control unit 35 functions as an adjustment unit.

Suppose that the detection circuit 24 supplies a high-level voltage. The control unit 35 adjusts the duty ratio of the switching signal to a value obtained, for example, by dividing a certain predetermined set voltage by the output voltage of the battery 11. In this case, the average output voltage through the switch 20 to the load 12 can be adjusted to the set voltage, irrespective of the drain voltage of the switch 20, that is, irrespective of the output voltage of the battery 11.

The computer program P1 may be stored in a storage medium E1 such that the one or more CPUs in the control unit 35 can read the program. In this case, the computer program P1 is read out from the storage medium E1 by a readout device (not shown) and stored in the storage unit 34. The storage medium E1 is an optical disc, a flexible disc, a magnetic disc, a magnetic optical disc, a semiconductor memory, etc. The optical disc may be a CD (Compact Disc)-ROM (Read Only Memory), a DVD (Digital Versatile Disc)-ROM, a BD (Blu-Ray® Disc), etc. The magnetic disc may be, for example, a hard disk. Alternatively, the computer program P1 may also be downloaded from an external device (not shown) connected to a communication network (not shown) and may be stored in the storage unit 34.

As described above, if the detection circuit 24 does not detect a failure related to the switch 20, the control unit 35 controls the power supply from the battery 11 to the load 12, based on the input signal to the input unit 31.

The input voltage to the positive terminal of the comparator 25 is the sum of the output voltage of the battery 11 and the voltage across the DC power 29 (hereinafter referred to as "inter-terminal voltage"). In the following description, Vg denotes the gate voltage of the switch 20, Vb denotes the output voltage of the battery 11, and Vc denotes the inter-terminal voltage across the DC power 29. The gate voltage Vg and the output voltage Vb of the battery 11 are the voltages with respect to the ground potential.

If Vg>Vb+Vc, that is, if Vg−Vb>Vc, the comparator 25 supplies a low-level voltage from its output end to the detection circuit 24 and the inverter 26. If Vg<Vb+Vc, that is, if Vg−Vb≤Vc, the comparator 25 supplies a high-level voltage from its output end to the detection circuit 24 and the inverter 26.

If the gate voltage Vg of the switch 20 is greater than the total voltage Vp of the sum of the output voltage Vb of the battery 11 and the interterminal voltage Vc, the switch 20 is on. If the gate voltage Vg of the switch 20 is not greater than the total voltage Vp, the switch 20 is not on.

The gate of the switch 20 functions as a control terminal. The total voltage Vp corresponds to the threshold voltage.

If Vg>Vp (=Vb+Vc), the comparator 25 detects the on-state and supplies a low-level voltage from its output end. If Vg≤Vp, the comparator 25 does not detect the on-state and supplies a high-level voltage from its output end. The comparator 25 functions as an on-detection unit.

On receiving a high-level voltage from the comparator 25, the inverter 26 supplies a low-level voltage from its output end to the detection circuit 24. On receiving a low-level voltage from the comparator 25, the inverter 26 supplies a high-level voltage from its output end to the detection circuit 24.

The clock circuit 27 supplies a clock signal having a high-level voltage and a low-level voltage to the detection circuit 24. The clock signal periodically changes from the low-level voltage to the high-level voltage.

The output unit 33 of the microcomputer 21 supplies a switching signal not only to the first AND circuit 23 but also to the detection circuit 24 and the reset circuit 28.

Based on the switching signal supplied from the output unit 33, the reset circuit 28 supplies a reset signal having a high-level voltage or a low-level voltage, to the detection circuit 24. If the voltage of the switching signal that has been at the low-level voltage over a prescribed period changes from the low-level voltage to the high-level voltage, the reset signal changes from the low-level voltage to the high-level voltage. The voltage of the reset signal, which has changed from the low-level voltage to the high-level voltage, returns to the low-level voltage immediately.

The detection circuit 24 detects a failure related to the switch 20, based on the output voltage of the comparator 25, the output voltage of the inverter 26, the switching signal, the clock signal, and the reset signal. As described above, when the detection circuit 24 detects a failure related to the switch 20, a low-level voltage is supplied to the first AND circuit 23. When the detection circuit 24 does not detect a failure related to the switch 20, a high-level voltage is supplied to the first AND circuit 23. Once the detection circuit 24 has changed to supply the low-level voltage, the detection circuit 24 continues to supply the low-level voltage, irrespective of the output voltage of the comparator 25, the output voltage of the inverter 26, the switching signal, the clock signal, and the reset signal.

Figure 2:
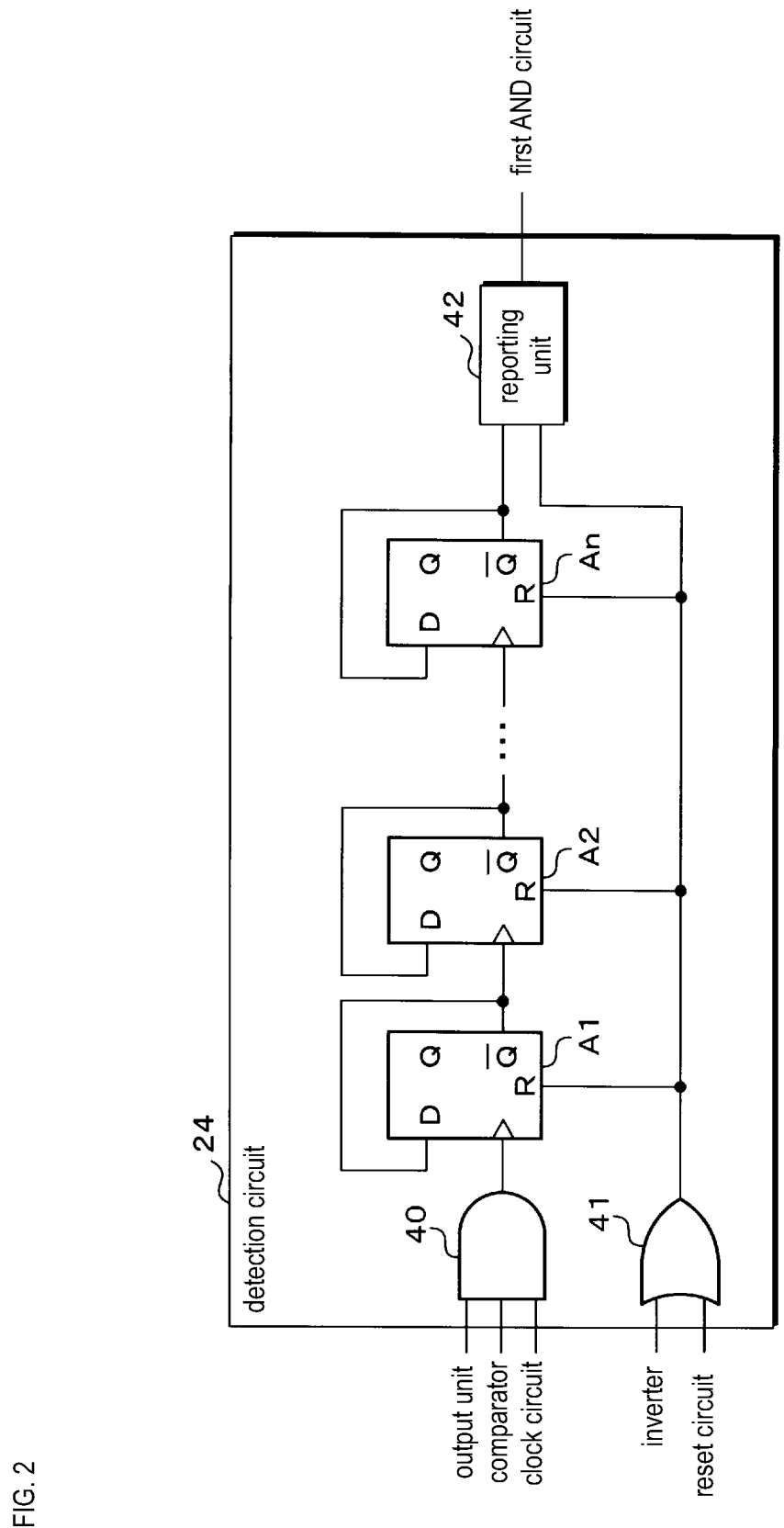
FIG. 2 is a circuit diagram of a detection circuit.

FIG. 2 is a circuit diagram of the detection circuit 24. The detection circuit 24 includes a second AND circuit 40, an OR circuit 41, a reporting unit 42, and n D flip-flops A1, A2, . . . , An (n being an integer of 2 or greater). The second AND circuit 40 has three input ends and an output end. The OR circuit 41 has two input ends and an output end. Each of the D flip-flops A1, A2, . . . , An has a D terminal, a clock terminal, an R terminal, a Q terminal, and a not-Q terminal.

The second AND circuit 40 is connected with the output end of the output unit 33 of the microcomputer 21 at the first input end, connected with the output terminal of the comparator 25 at the second input end, and connected with the output end of the clock circuit 27 at the third input end. The output end of the second AND circuit 40 is connected with a clock terminal of the D flip-flop A1.

The n D flip-flops A1, A2, . . . , An are connected in series. Specifically, the not-Q terminal of the k-th D flip-flop Ak (k being a natural number less than n) is connected with the clock terminal of the (k+1)-th D flip-flop Ak+1. The not-Q terminal of the n-th D flip-flop An is connected with the reporting unit 42. In each of the n D flip-flops A1, A2, . . . , An, the not-Q terminal is also connected with the D terminal, as shown in FIG. 2.

The OR circuit 41 is connected with the output end of the inverter 26 at the first input end, and connected with the output end of the reset circuit 28 at the second input end. The output end of the OR circuit 41 is connected with the reset terminals of the n D flip-flops A1, A2, . . . , An and the reporting unit 42. The reporting unit 42 is also connected with the second input end of the first AND circuit 23. The Q terminals of the n D flip-flops A1, A2, . . . , An are open circuit terminals.

As inputs, the second AND circuit 40 receives the switching signal from the output unit 33 of the microcomputer 21, the output voltage from the comparator 25, and the clock signal from the clock circuit 27. As an output, the second AND circuit 40 supplies a high-level voltage or a low-level voltage to the clock terminal of the D flip-flop A1.

If both of the voltage of the switching signal and the output voltage of the comparator 25 are at the high level, the output from the output end of the second AND circuit 40 to the clock terminal of the D flip-flop A1 is the clock signal fed from the clock circuit 27. If at least one of the voltage of the switching signal and the output voltage of the comparator 25 is at the low level, the output from the second AND circuit 40 to the clock terminal of the D flip-flop A1 is the low-level voltage, irrespective of the voltage of the clock signal.

In each of the n D flip-flops A1, A2, . . . , An, the not-Q terminal sends out the high-level voltage or the low-level voltage, and the output voltage of the not-Q terminal enters the D terminal of the own D flip-flop.

The thus configured n D flip-flops A1, A2, . . . , An operate in the following manner. While the not-Q terminal is sending out the high-level voltage, if the input voltage to the clock terminal changes from the low-level voltage to the high-level voltage, then the output voltage of the not-Q terminal changes to the low-level voltage. While the not-Q terminal is sending out the low-level voltage, if the input voltage to the clock terminal changes from the low-level voltage to the high-level voltage, then the output voltage of the not-Q terminal changes to the high-level voltage. The not-Q terminal of the n-th D flip-flop An sends out the high-level voltage or the low-level voltage to the reporting unit 42.

The OR circuit 41 receives the output voltage of the inverter 26 and the reset signal from the reset circuit 28. If at least one of the output voltage of the inverter 26 and the voltage of the reset signal is at the high level, the OR circuit 41 supplies a high-level voltage from its output end to the reset terminals of the n D flip-flops A1, A2, . . . , An and to the reporting unit 42. If both of the output voltage of the inverter 26 and the voltage of the reset signal are at the low level, the OR circuit 41 supplies a low-level voltage from its output end to the reset terminals of the n D flip-flops A1, A2, . . . , An and to the reporting unit 42.

If the output voltage of the OR circuit 41 has changed from the low-level voltage to the high-level voltage, all of the n D flip-flops A1, A2, . . . , An uniformly supply the high-level voltage from the respective not-Q terminals.

While the OR circuit 41 is supplying the low-level voltage, the reporting unit 42 continues to supply the high-level voltage to the first AND circuit 23 until the output voltage of the not-Q terminal of the D flip-flop An changes from the low-level voltage to the high-level voltage.

While the OR circuit 41 is supplying the low-level voltage, the reporting unit 42 changes its output voltage to the first AND circuit 23 to the low-level voltage when the output voltage of the not-Q terminal of the D flip-flop An changes from the low-level voltage to the high-level voltage.

In response, the drive circuit 22 turns off the switch 20, irrespective of the switching signal. After the reporting unit 42 has changed its output voltage to the first AND circuit 23 to the low-level voltage, the reporting unit 42 continues to supply the low-level voltage to the first AND circuit 23, irrespective of the output voltage of the not-Q terminal of the D flip-flop An and the output voltage of the OR circuit 41.

The following description concerns the operation of the detection circuit 24 in the case where the switch 20 turns on normally.

Figure 3:
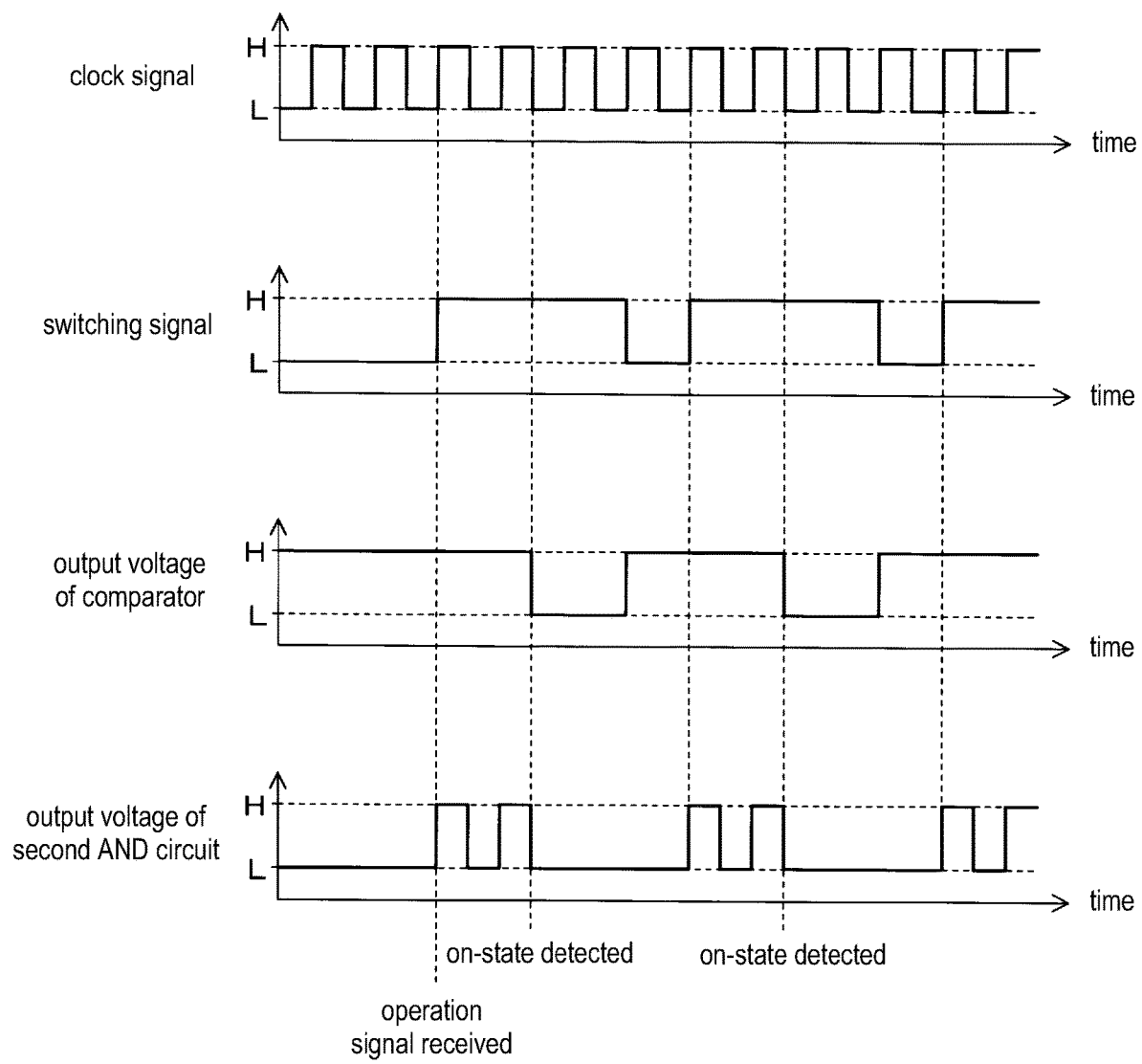
FIG. 3 is a timing diagram showing an example of the operation of a second AND circuit.

FIG. 3 is a timing diagram showing an example of the operation of the second AND circuit 40. FIG. 3 shows the changes in the voltage of the clock signal, the voltage of the switching signal, the output voltage of the comparator 25, and the output voltage of the second AND circuit 40. The horizontal axis in each row represents time. In FIG. 3 and FIGS. 4 to 8 (to be described), "H" indicates a high-level voltage, and "L" indicates a low-level voltage.

The clock signal, as described above, periodically changes from the low-level voltage to the high-level voltage. While the switching signal is fixed at the low-level voltage and the power supply to the load 12 is stopped, the gate voltage Vg of the switch 20 is approximately 0 V, being not greater than the total voltage Vp as the sum of the output voltage Vb of the battery 11 and the interterminal voltage Vc across the DC power 29. Since Vg≤Vp, the comparator 25 supplies a high-level voltage. The switching signal fixed at the low-level voltage also causes the second AND circuit 40 to supply a low-level voltage.

In the microcomputer 21, if the input unit 31 receives an operation signal, the output unit 33 produces a switching signal that alternates between the high-level voltage and the low-level voltage. When the voltage of the switching signal changes from the low-level voltage to the high-level voltage, the drive circuit 22 raises the gate voltage Vg of the switch 20 as described above. After the voltage of the switching signal has changed from the low-level voltage to the high-level voltage, the comparator 25 continues to supply the high-level voltage until the gate voltage Vg exceeds the total voltage Vp.

When the gate voltage Vg exceeds the total voltage Vp, the comparator 25 detects the on-state of the switch 20 and changes its output voltage to the second AND circuit 40 from the high-level voltage to the low-level voltage. When the voltage of the switching signal has changed to the low-level voltage, the drive circuit 22 reduces the gate voltage Vg of the switch 20. The reduced gate voltage Vg is not greater than the total voltage Vp, causing the comparator 25 to change its output voltage to the second AND circuit 40 to the high-level voltage.

During the period when the switching signal is at the high-level voltage but the comparator 25 continues to supply the high-level voltage, the second AND circuit 40 supplies the clock signal to the clock terminal of the D flip-flop A1. Except for this period, the second AND circuit 40 supplies a low-level voltage to the clock terminal of the D flip-flop A1.

The period when the comparator 25 supplies a high-level voltage corresponds the period when the comparator 25 does not detect the on-state of the switch 20.

Figure 4:
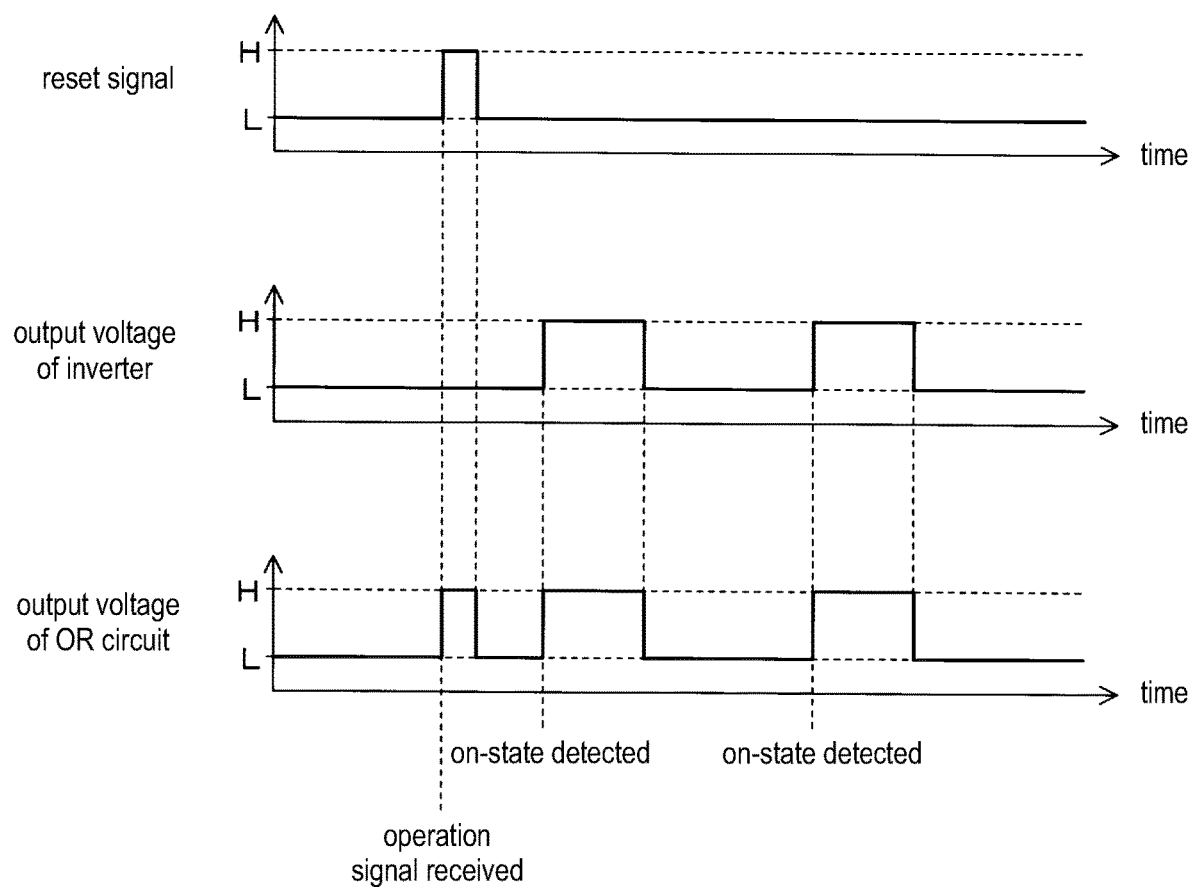
FIG. 4 is a timing diagram showing an example of the operation of an OR circuit.

FIG. 4 is a timing diagram showing an example of the operation of the OR circuit 41. FIG. 4 shows the changes in the voltage of the reset signal, the output voltage of the inverter 26, and the output voltage of the OR circuit 41. The horizontal axis in each row represents time.

While the switching signal is fixed at the low-level voltage and the power supply to the load 12 is stopped, the period when the switching signal is at the low-level voltage is longer than the prescribed period which was described in relation to the reset circuit 28. Hence, if the input unit 31 of the microcomputer 21 has received an operation signal and the voltage of the switching signal has changed from the low-level voltage to the high-level voltage, the voltage of the reset signal changes from the low-level voltage to the high-level voltage, and returns to the low-level voltage immediately.

If the output unit 33 produces a switching signal that alternates between the high-level voltage and the low-level voltage, the voltage of the switching signal changes over periodically, as mentioned above. The prescribed period in the above description is longer than this changeover cycle. Hence, after the voltage of the switching signal has changed from the low-level voltage to the high-level voltage in response to the input of the operation signal, the reset signal is fixed at the low-level voltage and does not change to the high-level voltage as long as the voltage of the switching signal changes over periodically.

As described above, the inverter 26 supplies a low-level voltage while receiving a high-level voltage from the comparator 25, and supplies a high-level voltage while receiving a low-level voltage from the comparator 25. Accordingly, if the gate voltage Vg of the switch 20 is not greater than the total voltage Vp, that is, if the on-state of the switch 20 is not detected, the inverter 26 supplies a low-level voltage. If the gate voltage Vg exceeds the total voltage Vp, that is, if the on-state of the switch 20 is detected, the inverter 26 changes its output voltage to the OR circuit 41 to the high-level voltage. If the gate voltage Vg has decreased to the total voltage Vp or less, that is, if the on-state of the switch 20 is no longer detected, the inverter 26 changes its output voltage to the OR circuit 41 to the low-level voltage.

If the voltage of the reset signal has changed to the high-level voltage, that is, if an operation signal is supplied, the OR circuit 41 changes its output voltage to the high-level voltage. If the voltage of the reset signal has changed to the low-level voltage, the OR circuit 41 changes its output voltage to the low-level voltage.

Further, if the output voltage of the inverter 26 has changed to the high-level voltage, that is, if the on-state of the switch 20 is detected, the OR circuit 41 changes its output voltage from the low-level voltage to the high-level voltage. If the output voltage of the inverter 26 has changed to the low-level voltage, that is, if the on-state of the switch 20 is no longer detected, the OR circuit 41 changes its output voltage to the low-level voltage.

Figure 5:
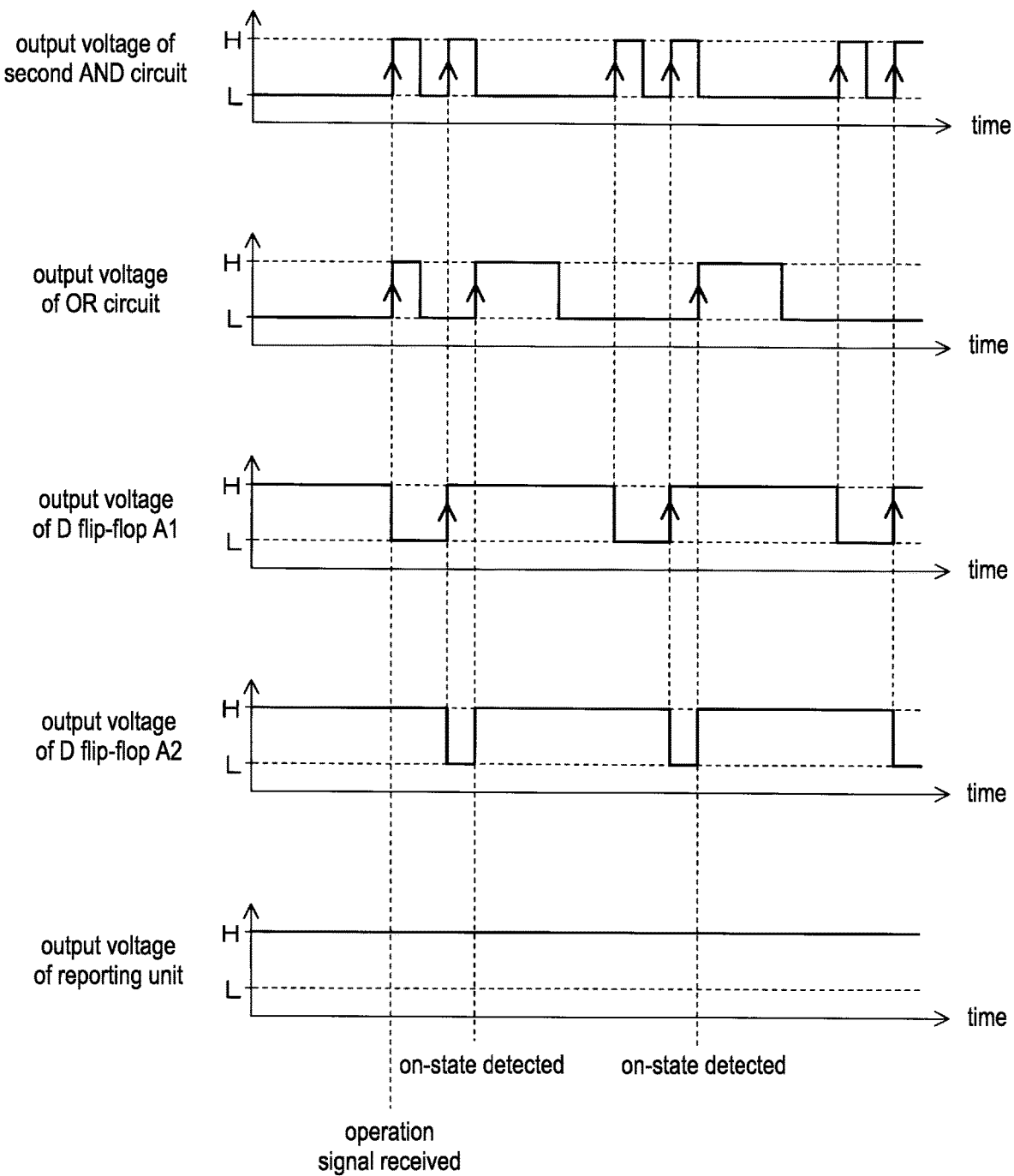
FIG. 5 is a timing diagram showing an example of the operation of a reporting unit.

FIG. 5 is a timing diagram showing an example of the operation of the reporting unit 42. The example shown in FIG. 5 employs two D flip-flops (i.e., n=2). FIG. 5 shows the changes in the output voltages of the second AND circuit 40, the OR circuit 41, the D flip-flops A1, A2, and the reporting unit 42. The horizontal axis in each row represents time.

The changes in the output voltage of the second AND circuit 40 are identical to the changes shown in FIG. 3. The changes in the output voltage of the OR circuit 41 are identical to the changes shown in FIG. 4.

When the operation signal is received, the output voltage of the OR circuit 41 changes to the high-level voltage as described above, and all of the n (i.e. two) D flip-flops A1, A2, . . . , An uniformly supply the high-level voltage from the respective Q terminals.

Thereafter, the output voltage of the D flip-flop A1 changes to the low-level voltage or the high-level voltage, every time the output voltage of the second AND circuit 40 changes to the high-level voltage. Accordingly, the output voltage of the D flip-flop A1 changes to the high-level voltage, when the number of times that the output voltage of the second AND circuit 40 changes to the high-level voltage has reached two to the first power (i.e., $2^1=2$) in the period after the output voltage of the OR circuit 41 has changed to the high-level voltage and before the output voltage of the OR circuit 41 changes to the high-level voltage the next time.

The output voltage of the D flip-flop A2 changes to a low-level voltage or a high-level voltage, every time the output voltage of the D flip-flop A1 changes to a high-level voltage. Accordingly, the output voltage of the D flip-flop A2 changes to a high-level voltage, when the number of times that the output voltage of the second AND circuit 40 changes to the high-level voltage has reached two to the second power (i.e., $2^2=4$) in the period after the output voltage of the OR circuit 41 has changed to the high-level voltage and before the output voltage of the OR circuit 41 changes to the high-level voltage the next time.

Similarly, the output voltage of the m-th D flip-flop Am (m being a natural number of not less than 3 and not greater than n) changes to a low-level voltage or a high-level voltage, every time the output voltage of the (m−1)-th D flip-flop Am−1 changes to a high-level voltage. Accordingly, the output voltage of the m-th D flip-flop Am changes to the high-level voltage, when the number of times that the output voltage of the second AND circuit 40 changes to the high-level voltage has reached two to the m-th power (i.e., $2^m$) in the period after the output voltage of the OR circuit 41 has changed to the high-level voltage and before the output voltage of the OR circuit 41 changes to the high-level voltage the next time.

Accordingly, the output voltage of the D flip-flop An changes to a high-level voltage, when the number of times that the output voltage of the second AND circuit 40 changes to a high-level voltage has reached two to the n-th power (i.e., $2^n$) in the period after the output voltage of the OR circuit 41 has changed to the high-level voltage and before the output voltage of the OR circuit 41 changes to the high-level voltage the next time.

Thus, the n D flip-flops A1, A2, . . . , An count the number of times that the output voltage of the second AND circuit 40 changes from the low-level voltage to the high-level voltage.

As described above, the second AND circuit 40 supplies the clock signal during the period when the switching signal is at the high-level voltage but the comparator 25 continues to supply the high-level voltage, and the second AND circuit 40 supplies a low-level voltage except this period. Hence, the number of times that the output voltage of the second AND circuit 40 changes to the high-level voltage corresponds to the number of complete cycles of the clock signal. Consequently, counting of the number of times that the output voltage of the second AND circuit 40 changes to a high-level voltage corresponds to an accumulation of the periods when the switching signal is at the high-level voltage but the comparator 25 continues to supply the high-level voltage. If the accumulated period has reached ((two to the n-th power)−1)·(one complete cycle of the clock signal), where the symbol "•" denotes multiplication, the output voltage of the D flip-flop An changes to the high-level voltage.

If the switch 20 turns on normally, the on-state of the switch 20 is detected before the number of times that the output voltage of the second AND circuit 40 changes to the high-level voltage, counted after the output voltage of the OR circuit 41 has changed to the high-level voltage, reaches two to the n-th power ($2^n$, i.e., four), as shown in FIG. 5.

As a result, the output voltage of the OR circuit 41 changes to the high-level voltage, and all of the n (i.e., two) D flip-flops A1, A2, . . . , An uniformly supply the high-level voltage from the respective Q terminals. As a consequence, the OR circuit 41 initializes the number of times that the output voltage of the second AND circuit 40 changes to the high-level voltage, that is, it initializes the accumulated period when the switching signal is at the high-level voltage but the comparator 25 continues to supply the high-level voltage.

As described above, when the comparator 25 detects that the on-state of the switch 20, the OR circuit 41 changes its output voltage from the low-level voltage to the high-level voltage, and initializes the accumulated period to zero. The OR circuit 41 functions as an initialization unit.

Hence, if the switch 20 turns on normally, the reporting unit 42 keeps its output voltage to the first AND circuit 23 at the high level and does not report a failure related to the switch 20.

Similarly, if the switch 20 turns on normally, the drive circuit 22 turns switch 20 on or off according to the switching signal.

Incidentally, as shown in FIG. 5, when the output voltage of the OR circuit 41 changes to the high-level voltage, the output voltage of the D flip-flop An (i.e., A2) to the reporting unit 42 is also likely to change to the high-level voltage. In this situation, the output voltage of the OR circuit 41 and the output voltage of the D flip-flop An change substantially simultaneously to the high-level voltage. Hence, the reporting unit 42 does not change its output voltage to the first AND circuit 23 to the low level, but instead keeps its output voltage at the high level. This arrangement prevents the reporting unit 42 from wrongly reporting a failure related to the switch 20 when the output voltage of the OR circuit 41 changes to the high-level voltage.

The next description concerns the operation of the detection circuit 24 in the case where a failure related to the switch 20 has prevented the switch 20 from turning on.

Figure 6:
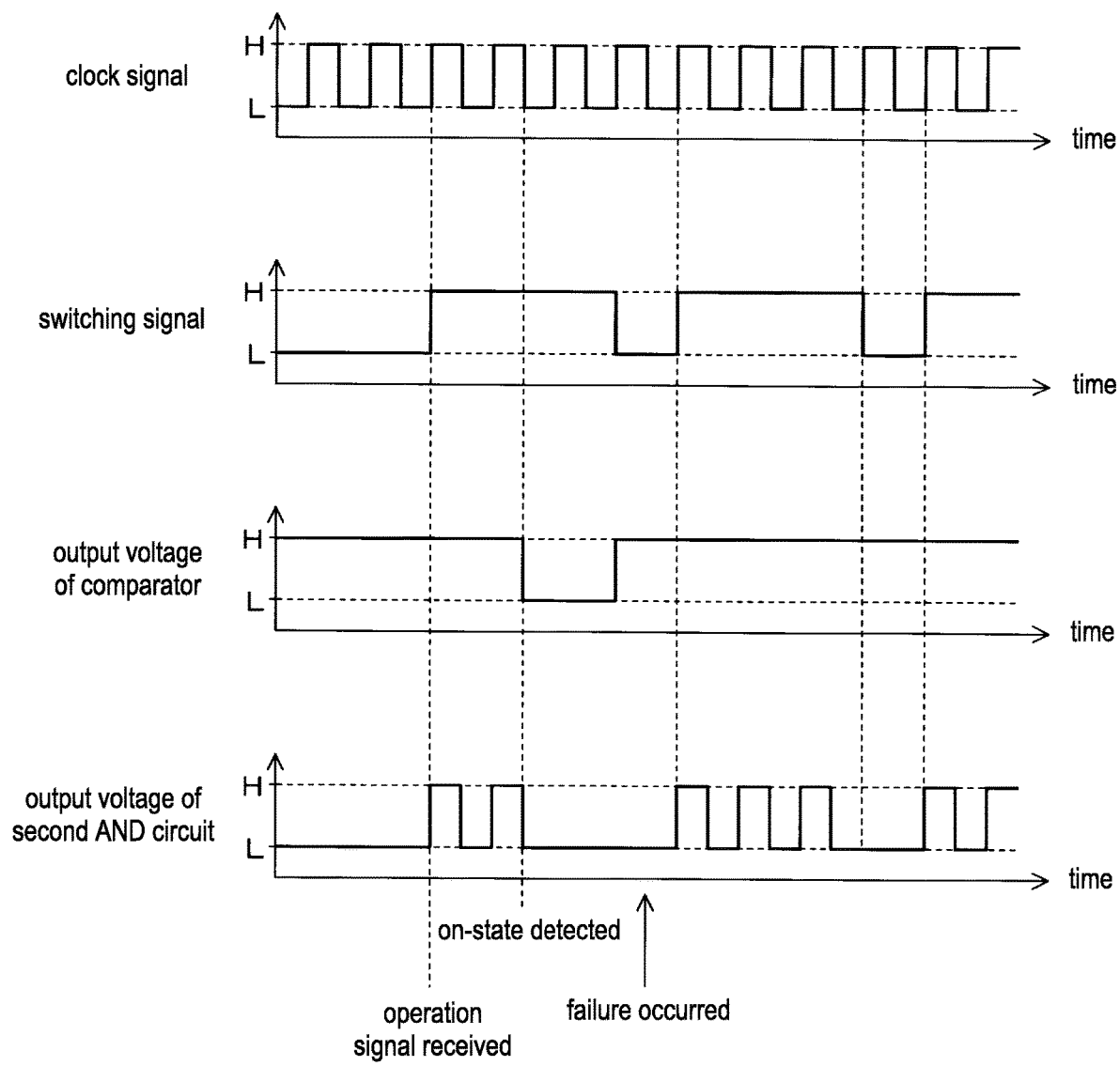
FIG. 6 is a timing diagram showing another example of the operation of the second AND circuit.

FIG. 6 is a timing diagram showing another example of the operation of the second AND circuit 40. FIG. 6, which corresponds to FIG. 3, shows the changes in the voltage of the clock signal, the voltage of the switching signal, the output voltage of the comparator 25, and the output voltage of the second AND circuit 40. The horizontal axis in each row represents time.

Suppose that a failure related to the switch 20 has prevented the gate voltage Vg of the switch 20 from being higher than the total voltage Vp. In this situation, even though the switching signal is continuously at the high-level voltage, the comparator 25 does not detect the on-state of the switch 20 and continues to supply the high-level voltage. Hence, after the occurrence of a failure related to the switch 20, the second AND circuit 40 supplies the clock signal if the switching signal is at the high-level voltage, and supplies a low-level voltage if the switching signal is at the low-level voltage.

Figure 7:
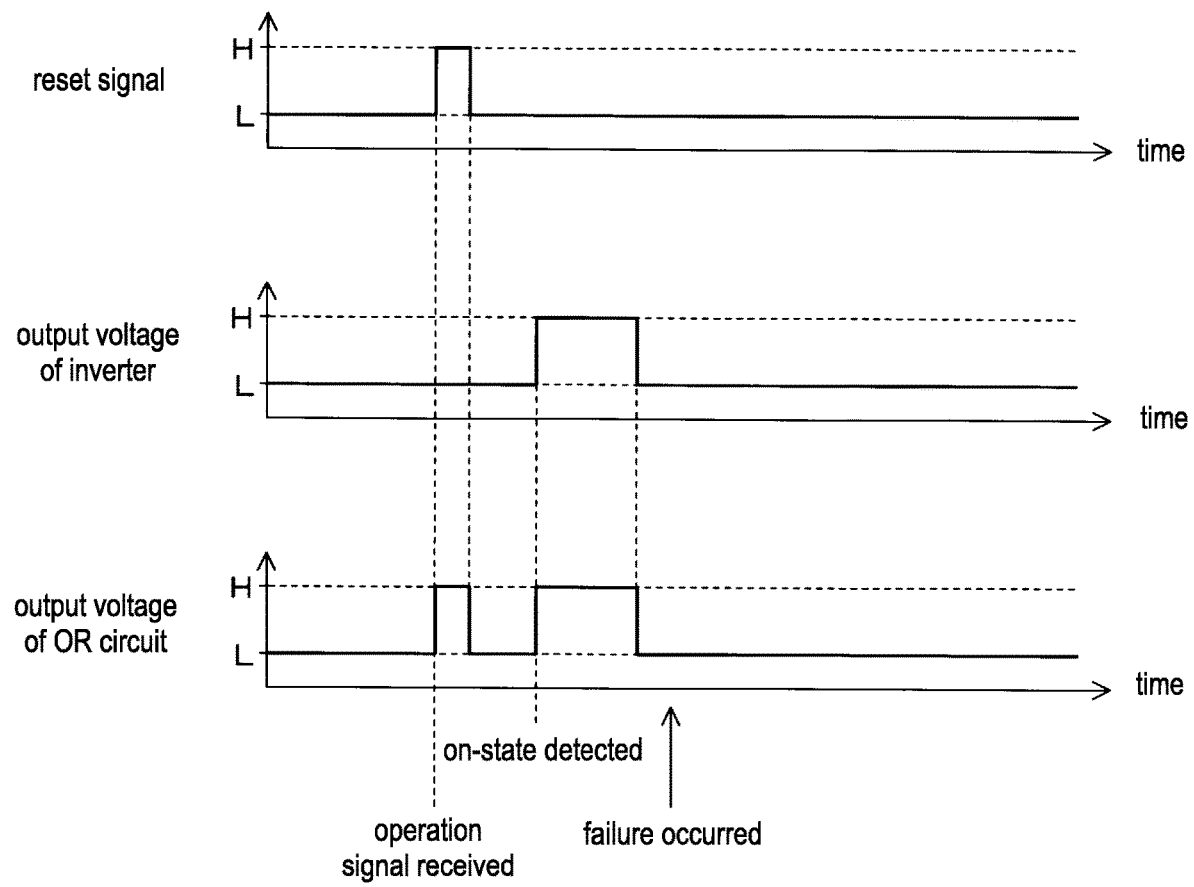
FIG. 7 is a timing diagram showing another example of the operation of the OR circuit.

FIG. 7 is a timing diagram showing another example of the operation of the OR circuit 41. FIG. 7, which corresponds to FIG. 4, shows the changes in the voltage of the reset signal, the output voltage of the inverter 26, and the output voltage of the OR circuit 41. The horizontal axis in each row represents time.

After the occurrence of a failure related to the switch 20, the comparator 25 does not detect the on-state, and the inverter 26 continues to supply the low-level voltage, as shown in FIG. 7. Along with the inverter 26, the OR circuit 41 continues to supply the low-level voltage.

Figure 8:
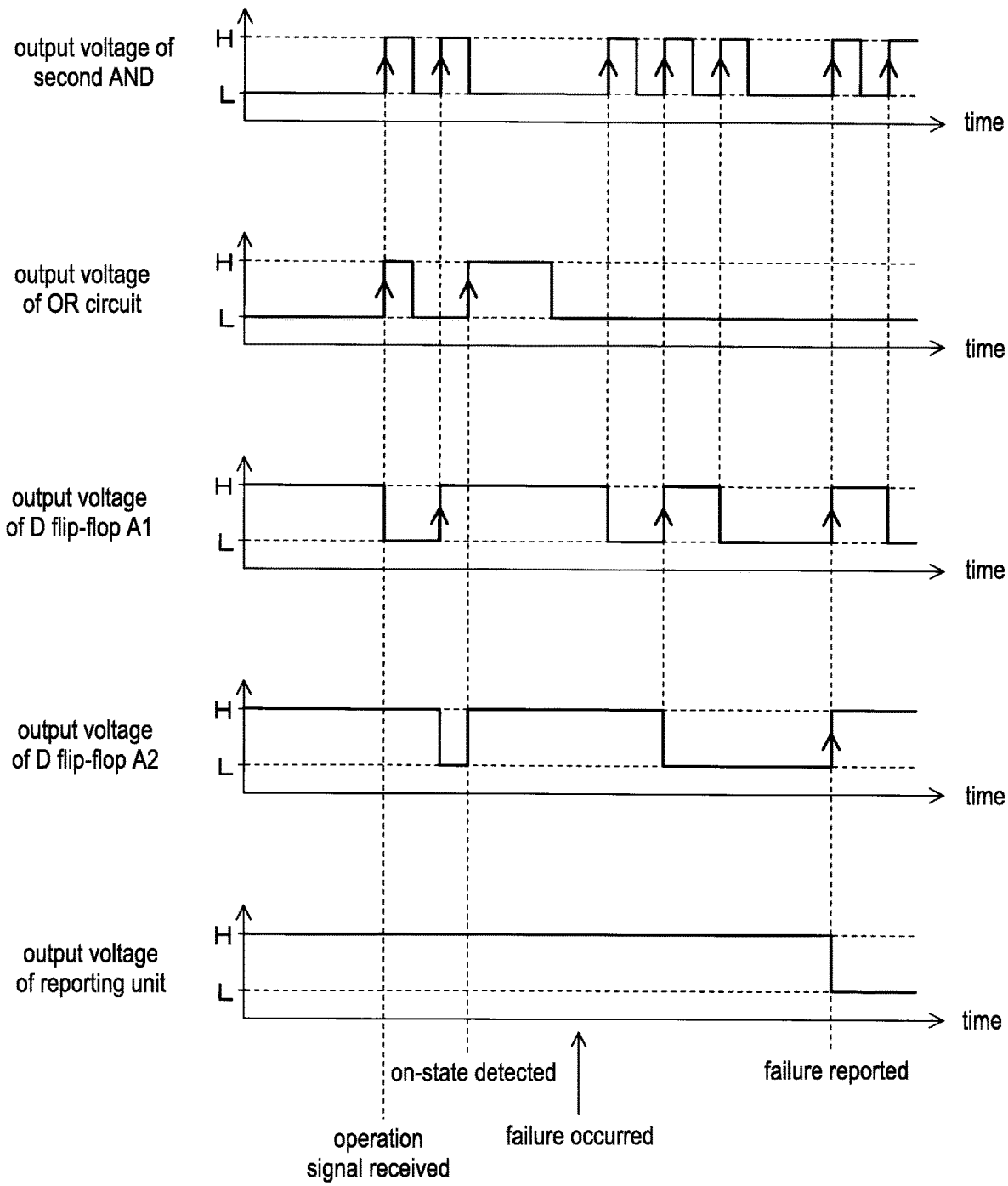
FIG. 8 is a timing diagram showing another example of the operation of the reporting unit.

FIG. 8 is a timing diagram showing another example of the operation of the reporting unit 42. FIG. 8, which corresponds to FIG. 5, similarly concerns an example with use of two D flip-flops (i.e., n=2). FIG. 8 shows the changes in the output voltages of the second AND circuit 40, the OR circuit 41, the D flip-flops A1, A2, and the reporting unit 42. The horizontal axis in each row represents time.

The changes in the output voltage of the second AND circuit 40 are identical to the changes shown in FIG. 6. The changes in the output voltage of the OR circuit 41 are identical to the changes shown in FIG. 7.

As shown in FIG. 8, after the switch 20 has failed, the output voltage of the OR circuit 41 does not change from the low-level voltage to the high-level voltage unless an operation signal is received. Hence, the OR circuit 41 does not initialize the counts by the n (i.e., two) D flip-flops A1, A2, . . . , An, that is, the accumulated period when the switching signal is at the high-level voltage but the comparator 25 continues to supply the high-level voltage.

When the number of times that the output voltage of the second AND circuit 40 changes to the high-level voltage has reached two to the n-th power (i.e., has reached four in the example of FIG. 8), that is, when the accumulated period has reached or exceeded ((two to the n-th power)−1)·(one complete cycle of the clock signal), the D flip-flop An (A2 in the example of FIG. 8) changes its output voltage to the reporting unit 42, from the low-level voltage to the high-level voltage. Since the output voltage of the OR circuit 41 is the low-level voltage at this moment, the reporting unit 42 changes its output voltage to the first AND circuit 23 to the low-level voltage and thus reports a failure related to the switch 20. The value of ((two to the n-th power)−1)·(one complete cycle of the clock signal) corresponds to the threshold period.

Incidentally, the value of ((two to the n-th power)−1)·(one complete cycle of the clock signal) is greater than the period after the voltage of the switching signal has changed from the low-level voltage to the high-level voltage and before the switch 20 actually turns on.

If the reporting unit 42 changes its output voltage to the first AND circuit 23 to the low-level voltage, that is, if the reporting unit 42 reports a failure related to the switch 20 to the first AND circuit 23, the drive circuit 22 turns the switch 20 off as described above, irrespective of the voltage of the switching signal. Also as described above, after the reporting unit 42 has changed its output voltage to the first AND circuit 23 to the low-level voltage, the reporting unit 42 continues to supply the low-level voltage to the first AND circuit 23, irrespective of the output voltage of the not-Q terminal of the D flip-flop An and the output voltage of the OR circuit 41. Consequently, the drive circuit 22 keeps the switch 20 off. The drive circuit 22 functions as a changeover unit.

To give an example, the on-state of the switch 20 cannot be detected in a state where the gate voltage Vg is raised by the drive circuit 22 but does not reach the total voltage Vp. In this state, the resistance between the drain and the source of the switch 20 is not high enough, allowing the current to flow through the switch 20. At the same time, the resistance between the drain and the source of the switch 20 is not low enough, causing significant power consumption and temperature rise in the switch 20. To stop the significant power consumption in the switch 20, the drive circuit 22 turns off the switch 20, irrespective of the voltage of the switching signal.

For detection of a failure related to the switch 20, the detection circuit 24 utilizes the accumulated period in the above-described manner. Consequently, even if the period when the switching signal continuously instructs the switch 20 to turn on is less than ((two to the n-th power)−1)·(one complete cycle of the clock signal), the detection circuit 24 can properly detect and report a failure related to the switch 20 when the switch 20 fails to turn on.

Further, the accumulated period is initialized when the on-state of the switch 20 is detected. In the configuration of detecting and reporting a failure related to the switch 20 based on accumulation of the period after the switching signal instructs the switch 20 to turn on and before the switch 20 actually turns on, such initialization prevents erroneous reporting of the failure.

Additionally, the manner for adjusting the duty ratio of the switching signal should not be limited to the adjustment of the average output voltage through the switch 20 to a prescribed value. The manner for adjusting the duty ratio of the switching signal may be, for example, adjustment of the average output current through the switch 20, the average power consumed by the load 12, or the like average to a prescribed value.

Embodiment 2

Figure 9:
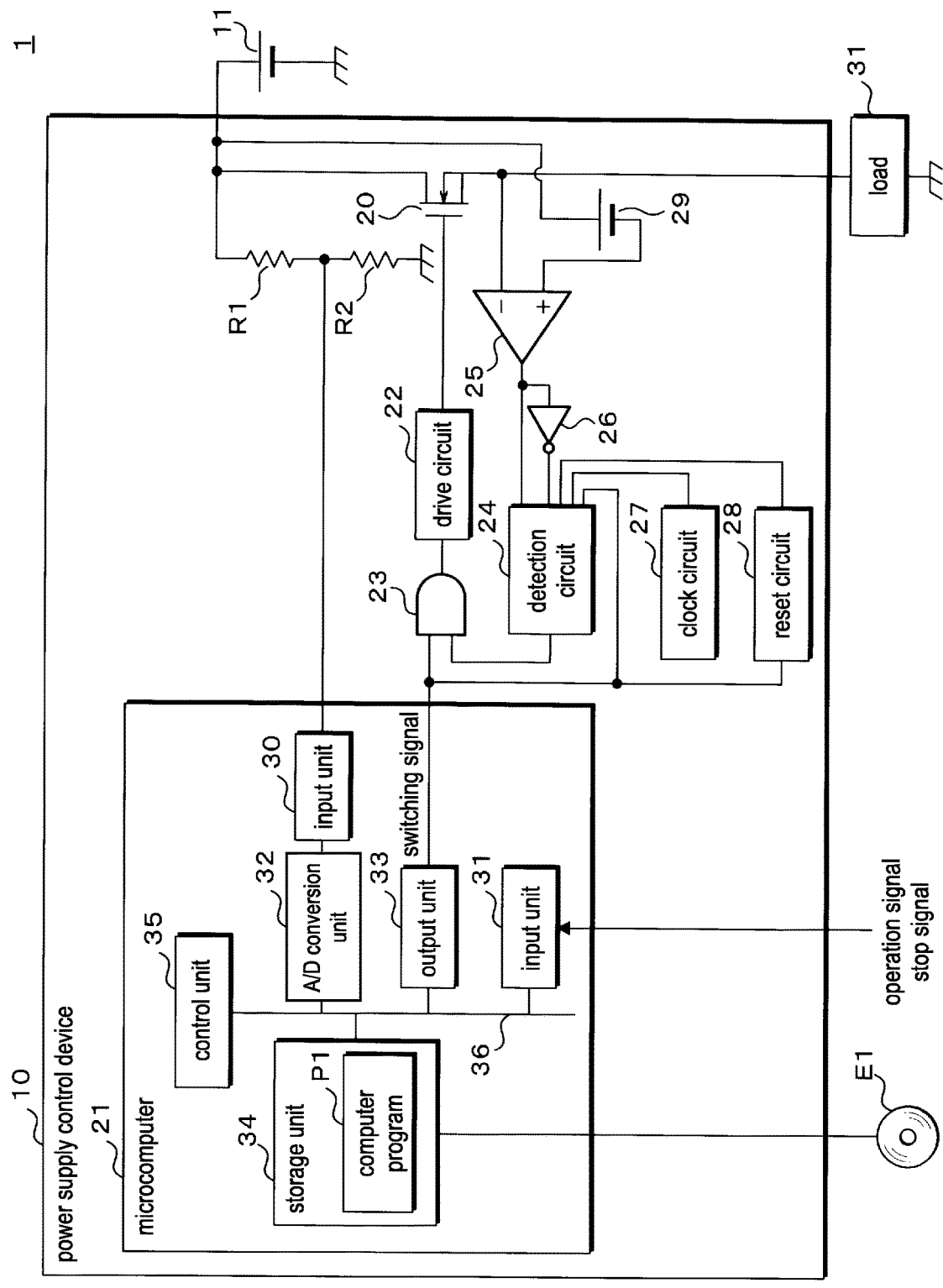
FIG. 9 is a block diagram showing a main configuration of a power system in Embodiment 2.

FIG. 9 is a block diagram showing a main configuration of a power system 1 according to Embodiment 2.

The following description of Embodiment 2 focuses on differences from Embodiment 1. Except such differences, Embodiment 2 is common to Embodiment 1. The common constitutive units are assigned with the same reference numerals as in Embodiment 1 to omit their description.

The power system 1 in Embodiment 2 similarly includes the constitutive units of the power system 1 in Embodiment 1. The power supply control device 10 in Embodiment 2 similarly includes the constitutive units of the power supply control device 10 in Embodiment 1. Embodiment 2 is distinguished from Embodiment 1 by the connection of the comparator 25 and the DC power 29.

In Embodiment 2, the negative terminal of the comparator 25 is connected with the source of the switch 20. The positive terminal of the comparator 25 is connected with the negative electrode of the DC power 29. The positive electrode of the DC power 29 is connected with the drain of the switch 20. The output end of the comparator 25 is connected with the detection circuit 24 and the input end of the inverter 26, just as in Embodiment 1.

In the following description, Vd denotes a difference voltage obtained by subtracting the interterminal voltage Vc across the DC power 29 from the output voltage Vb of the battery 11.

When the switch 20 is on, the resistance between the drain and the source of the switch 20 is low enough to keep the source voltage Vs of the switch 20 over the difference voltage Vd (=Vb−Vc). If the switch 20 is not on, the resistance between the drain and the source of the switch 20 is so high that the source voltage Vs of the switch 20 is not greater than the difference voltage Vd.

If Vs>Vd (=Vb−Vc), that is, if (Vb−Vs)<Vc, the comparator 25 detects the on-state, and supplies a low-level voltage from the output end. If Vs≤Vd, that is, if (Vb−Vs)≥Vc, the comparator 25 does not detect the on-state, and supplies a high-level voltage from the output end. The difference voltage Vd corresponds to a second threshold voltage.

While the detection circuit 24 supplies a high-level voltage to the first AND circuit 23, if the voltage of the switching signal supplied from the output unit 33 changes from the low-level voltage to the high-level voltage, the drive circuit 22 raises the gate voltage Vg of the switch 20, which in turn raises the source voltage Vs of the switch 20. Hence, similar to Embodiment 1, this embodiment requires a period after the voltage of the switching signal has changed from the low-level voltage to the high-level voltage and before the output voltage of the comparator 25 changes from the high-level voltage to the low-level voltage.

Thus, the detection circuit 24 operates just as described in Embodiment 1. As a result, the detection circuit 24 reports a failure related to the switch 20 if an accumulated period has reached or exceeded ((two to the n-th power)−1)·(one complete cycle of the clock signal), the accumulated period being an accumulation of the periods when the switching signal instructs the switch to turn on but the source voltage Vs of the switch 20 is less than the difference voltage Vd.

Embodiments 1 and 2 are configured to detect the on-state of the switch 20, based on the gate voltage Vg of the switch 20 or the source voltage Vs of the switch 20. The configuration for on-detection of the switch 20 should not be limited thereto, and may be, for example, based on the voltage between the drain and the source of the switch 20. This alternative configuration detects the on-state of the switch 20 when the drain-source voltage of the switch 20 is low, and does not detect the on-state of the switch 20 when the drain-source voltage of the switch 20 is high.

Embodiments 1 and 2 may be arranged to detect the on-state of the switch 20, based on two or three values selected from the gate voltage Vg of the switch 20, the source voltage Vs of the switch 20, and the drain-source voltage of the switch 20. For example, the on-state of the switch 20 may be detected if the gate voltage Vg is greater than the total voltage Vp and the source voltage Vs is greater than the difference voltage Vd. In this case, the on-state of the switch 20 is not detected if the gate voltage Vg is not greater than the total voltage Vp or if the source voltage Vs is not greater than the difference voltage Vd.

Further, the clock signal supplied from the clock circuit 27 should not necessarily be the signal that periodically changes from the low-level voltage to the high-level voltage, but may be a signal that periodically changes from the high-level voltage to the low-level voltage. In this case, the detection circuit 24 has an additional inverter (not shown). The second AND circuit 40 supplies a high-level voltage or a low-level voltage to the additional inverter, which in turn supplies a high-level voltage or a low-level voltage to the clock terminal of the D flip-flop A1. The additional inverter supplies a low-level voltage when receiving the high-level voltage, and supplies a high-level voltage when receiving the low-level voltage.

Additionally, the configuration for reporting a failure related to the switch 20 when the accumulated period has reached or exceeded the threshold period should not be limited to the use of n D flip-flops A1, A2, . . . , An, but may instead employ a plurality of T flip-flops, a microcomputer, or the like.

The switch 20 should not necessarily be an N-channel FET, but may be a P-channel FET, a bipolar transistor, etc.

Embodiments 1 and 2 disclosed herein are considered in all respects as illustrative and not restrictive. The scope of the disclosure is indicated by the appended claims rather than in the above-described sense, and is intended to encompass all variations and modifications indicated by, equivalent to, and falling within the appended claims.

What is claimed is:

1. A power supply control device which controls power supply via a switch, the device comprising:
   an output unit configured to produce a switching signal that instructs the switch to turn alternately on and off;
   an on-detection unit configured to detect an on-state of the switch; and
   a reporting unit configured to report a failure, the failure being the number of times the switching signal produced by the output unit instructs the switch to turn on but the on-detection unit does not detect the on-state of the switch occurs within an accumulated period.

2. The power supply control device according to claim 1, further comprising an initialization unit configured to initialize the accumulated period when the on-detection unit detects the on-state of the switch.

3. The power supply control device according to claim 1, wherein the switch is a semiconductor switch,
   the switch is on when a voltage at a control terminal of the switch is greater than a threshold voltage, and
   the on-detection unit detects the on-state if the voltage at the control terminal is greater than the threshold voltage.

4. The power supply control device according to claim 1, wherein the on-detection unit detects the on-state if a voltage at an output terminal of the switch where the current comes out is greater than a second threshold voltage.

5. The power supply control device according to claim 1, further comprising a changeover unit configured to turn off the switch if the reporting unit reports the failure, irrespective of the switching signal produced by the output unit.

6. The power supply control device according to claim 1, further comprising an adjustment unit configured to adjust a duty ratio of the switching signal produced by the output unit, depending on a voltage at an input terminal of the switch where the current enters.

7. A power supply control method which controls power supply via a switch,
   the method comprising the steps of:
   producing a switching signal that instructs the switch to turn alternately on and off;
   detecting an on-state of the switch; and
   reporting a failure related to the switch, the failure being the number of times the switching signal instructs the switch to turn on but the on-state of the switch is not detected occurs within an accumulated period.

8. The power supply control device according to claim 2, wherein the switch is a semiconductor switch, and the switch is on when a voltage at a control terminal of the switch is greater than a threshold voltage, and the on-detection unit detects the on-state if the voltage at the control terminal is greater than the threshold voltage.

9. The power supply control device according to claim 2, wherein the on-detection unit detects the on-state if a voltage at an output terminal of the switch where the current comes out is greater than a second threshold voltage.

10. The power supply control device according to claim 2, further comprising a changeover unit configured to turn off the switch if the reporting unit reports the failure, irrespective of the switching signal produced by the output unit.

11. The power supply control device according to claim 3, further comprising a changeover unit configured to turn off the switch if the reporting unit reports the failure, irrespective of the switching signal produced by the output unit.

12. The power supply control device according to claim 4, further comprising a changeover unit configured to turn off the switch if the reporting unit reports the failure, irrespective of the switching signal produced by the output unit.

13. The power supply control device according to claim 2, further comprising an adjustment unit configured to adjust a duty ratio of the switching signal produced by the output unit, depending on a voltage at an input terminal of the switch where the current enters.

14. The power supply control device according to claim 3, further comprising an adjustment unit configured to adjust a duty ratio of the switching signal produced by the output unit, depending on a voltage at an input terminal of the switch where the current enters.

15. The power supply control device according to claim 4, further comprising an adjustment unit configured to adjust a duty ratio of the switching signal produced by the output unit, depending on a voltage at an input terminal of the switch where the current enters.

16. The power supply control device according to claim 5, further comprising an adjustment unit configured to adjust a duty ratio of the switching signal produced by the output unit, depending on a voltage at an input terminal of the switch where the current enters.

* * * * *